(12) United States Patent
Tsunoda

(10) Patent No.: US 8,169,348 B2
(45) Date of Patent: May 1, 2012

(54) PARALLEL-SERIAL CONVERTER CIRCUIT

(75) Inventor: Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 12/907,399

(22) Filed: Oct. 19, 2010

(65) Prior Publication Data

US 2011/0122002 A1 May 26, 2011

(30) Foreign Application Priority Data

Nov. 20, 2009 (JP) ................................. 2009-264582

(51) Int. Cl.
H03M 9/00 (2006.01)

(52) U.S. Cl. ....................................... 341/101; 341/100
(58) Field of Classification Search .................. 341/101, 341/100
See application file for complete search history.

(56) References Cited

U.S. PATENT DOCUMENTS

| 7,079,055 | B2 * | 7/2006 | Padaparambil | 341/101 |
| 7,551,107 | B2 * | 6/2009 | Shim et al. | 341/101 |
| 7,864,084 | B2 * | 1/2011 | Padaparambil | 341/101 |

FOREIGN PATENT DOCUMENTS

| JP | 8-065173 A | 3/1996 |
| JP | 2002-009629 A | 1/2002 |

* cited by examiner

Primary Examiner — Khai M Nguyen
(74) Attorney, Agent, or Firm — Fujitsu Patent Center

(57) ABSTRACT

In a parallel-serial converter circuit of a multistage configuration, there is formed a clock propagation path so that when multistage connected data converters are operated according to the timing of a clock signal, a reference clock signal or a clock signal in which the reference clock signal has been frequency-converted, is given sequentially to the data converter of the first stage up to the data converter of the final stage. As a result, even in a case where variations occur in power supply voltage, timing deviation of data signals and clock signals input to the data converters of the second and subsequent stages can be suppressed, and parallel-serial conversion of high-speed data signals can be reliably executed.

8 Claims, 6 Drawing Sheets

PARALLEL-SERIAL CONVERTER CIRCUIT

CROSS-REFERENCE TO RELATED APPLICATION

This application is based upon and claims the benefit of priority of the prior Japanese Patent Application No. 2009-264582, filed on Nov. 20, 2009, the entire contents of which are incorporated herein by reference.

FIELD

The embodiments discussed herein are related to a parallel-serial converter circuit of a multistage configuration which converts parallel data into serial data, using clock signals.

BACKGROUND

In recent years, in the field of telecommunication, the speeding up of data rate accompanying the increase in data traffic is progressing. Normally, a high-speed data signal is generated by processing a plurality of low-speed parallel data signals in a parallel-serial converter circuit (MUX).

FIG. 1 is a diagram illustrating a configuration example of a general parallel-serial converter circuit. Moreover, FIG. 2 illustrates a timing chart of signals processed by the circuit of FIG. 1.

The parallel-serial converter circuit illustrated in FIG. 1 serial-converts data signals Din0 and Din1 which are parallel-input to two input terminals IN0 and IN1, using a plurality of flip-flops 1-1, 1-2, 1-3, 1-4, and 1-5, and a selector 2, to thereby generate a data signal Dout having a twofold data rate, and outputs this data signal Dout from an output terminal OUT.

Specifically, one of the input data signals Din0 is latched sequentially by the cascade-connected three flip-flops 1-1, 1-2, and 1-3, and is then input as one selection data signal D0 to the selector 2. The other input data signal Din1 is latched sequentially by the cascade-connected two flip-flops 1-4 and 1-5, and is then input as another selection data signal D1 to the selector 2. The respective flip-flops 1-1 to 1-5 serving as latching circuits, operate in accordance with a clock signal $CLK_L$ having a frequency corresponding to the data rate of the input data signals Din0 and Din1. The flip-flops 1-2 and 1-5 execute a setup and a hold according to the rising edge of the clock signal $CLK_L$, and the flip-flops 1-1, 1-3, and 1-4 execute a setup and a hold according to the falling edge of the clock signal $CLK_L$.

Consequently, the input data signals Din0 and Din1 are taken into the flip-flops 1-1 and 1-4 according to the falling edge of the clock signal $CLK_L$, and are sequentially sent to the next flip-flops 1-2, 1-3, and 1-5 in half a cycle of the clock signal $CLK_L$. Then the selection data signal D0 which has passed the three flip-flops 1-1, 1-2, and 1-3, and the selection data signal D1 which has passed the two flip-flops 1-4 and 1-5 become signals having phases that are different from each other by 180°, as illustrated in the third and fourth stage of FIG. 2, and are input to the selector 2. In this way, the input timing of the selection data signals D0 and D1 with respect to the selector 2 is adjusted by the flip-flops 1-1 to 1-5, which operates according to the clock signal $CLK_L$.

A clock signal $CLK_S$ having a frequency the same as that of the clock signal $CLK_L$ is supplied as a switching clock to the selector 2. The timing between the clock signal $CLK_L$ and the clock signal $CLK_S$ is adjusted by a buffer circuit B. The selector 2 switching-operates according to the clock signal $CLK_S$, and alternately selects the selection data signal D0 and the selection data signal D1 to thereby output a serial-converted data signal Dout. Here, as illustrated in the third to fifth stage of FIG. 2, the selector 2 selects the selection data signal D1 according to the rising edge of the clock signal $CLK_S$, and selects the selection data signal D0 according to the falling edge of the clock signal $CLK_S$. Consequently, the data signal Dout output from the selector 2 to the output terminal OUT becomes a serial data signal having a data rate corresponding to the twofold frequency of the clock signal $CLK_S$ as illustrated in the sixth stage of FIG. 2.

The above parallel-serial converter circuit of FIG. 1 is of a configuration in which a single serial data signal is generated from two parallel data signals. However, with application of a multistage configuration which combines a plurality of conversion units with this circuit serving as a single conversion unit, it is possible to realize a parallel-serial converter circuit capable of handling multiple parallel data signals, in which one serial data signal is generated from four parallel data signals for example (for example, refer to Japanese Laid-open Patent Publication No. 2002-9629 and Japanese Laid-open Patent Publication No. 08-65173).

FIG. 3 is a functional block diagram illustrating an example of a parallel-serial converter circuit of a two-stage configuration capable of handling four parallel data signals. In this parallel-serial converter circuit, four input data signals Din are parallel-input to a first stage data conversion section 11 and serial-converted two at a time, and the data conversion section 11 outputs two data signals having a data rate twice that of each input data signal Din. Furthermore, the output data signals of the data conversion section 11 are parallel-input to a second stage data conversion section 12 and serial-converted, and the data conversion section 12 outputs a single data signal Dout having a data rate four times that of each input data signal Din.

In a parallel-serial converter circuit of the above two-stage configuration, the frequency of a clock signal CLK" which drives the first stage data conversion section 11 is ½ of the frequency of the clock signal CLK' which drives the second data conversion section 12. Therefore, the circuit configuration on the clock side is generally of a configuration in which for example: a clock signal CLK having a frequency corresponding to the data rate of a post-serial conversion data signal Dout is externally given; the frequency of this clock signal CLK is divided into ½ in a frequency dividing circuit 21 to thereby generate a clock signal CLK'; this clock signal CLK' is sent to the second stage data conversion section 12; further, the frequency of the clock signal CLK' is divided into ½ in a frequency divider circuit 22 to thereby generate a clock signal CLK"; and this clock signal CLK" is sent to the first stage data conversion section 11.

Incidentally, as for a parallel-serial converter circuit to which the above configuration illustrated in FIG. 3 is applied, it is important that a data signal to be parallel-input to the data conversion section 12 of the latter stage, and a clock signal CLK' to be given to this data conversion section 12 are synchronized. The timing of the data signal to be input to the data conversion section 12 is dependant on propagation delay, which occurs between the timing of the clock signal CLK" given to the data conversion section 11 of the former stage and the moment at which the data signal output from this data conversion section 11 reaches the data conversion section 12 of the latter stage.

In the above configuration of FIG. 3, the propagation direction (the right to left direction in FIG. 3) of the clock signal on the frequency dividing circuits 21 and 22 side is opposite of the propagation direction (the left to right direction in FIG. 3) of the data signal on the data conversion sections 11 and 12 side. Therefore a differential delay (T1−T2) occurs between a propagation time T1 of a signal (clock signal CLK') which propagates through a path P1 from the output of the frequency dividing circuit 21 to the data conversion section 12, and a propagation time T2 of signals (clock signals CLK' and CLK", and a data signal output from parallel-serial conversion) which propagate through a path P2 from the output of the frequency dividing circuit 21 through the frequency dividing circuit 21 and the data conversion section 11 to the data conversion section 12. If the absolute value of this differential delay is an integral multiple of a single cycle of the clock signal CLK' given to the data conversion section 12, the data conversion section 12 is normally operated by the clock signal CLK'. Therefore, in a normal circuit design, the buffer circuit B serving as a delaying element is appropriately arranged on the propagation path of the respective clock signals CLK' and CLK" and on the propagation path of the data signal output from the data conversion section 11, and thereby the timing of the data signal and the clock signal CLK' to be parallel-input to the data conversion section 12 is optimized.

However, the above differential delay varies, depending on variations in power supply voltage and temperature of the parallel-serial converter circuit, and on manufacturing variations of the circuit. Therefore, variations in this differential delay influence the operation of the respective data conversion sections 11 and 12. Specifically, regarding the operation of the respective data conversion sections 11 and 12, the allowable value of timing deviation of clock signals for operating the flip-flops and selectors, which constitute the respective data conversion sections, becomes smaller accompanying the speeding up of data signals to be processed. Therefore, in a case of handling high-speed data rate, there is a problem in that variations in differential delay which occur as a result of variations and the like in the abovementioned power supply voltage, cause the timing deviation of clock signals to exceed the allowable value, and consequently errors occur during the process of parallel-serial conversion.

SUMMARY

According to an aspect of the invention, a parallel-serial converter circuit includes: a plurality of data conversion sections configured to convert a plurality of parallel-input data signals into serial data signals according to a timing of clock signals, and the respective data conversion sections are multistage-connected; a clock frequency conversion section configured to convert an externally given reference clock signal into a clock signal of a different frequency; and a clock propagation path which is formed so that frequency-corresponding clock signals among the reference clock signal and the clock signal which has been frequency-converted in the clock frequency conversion section, are given sequentially to the data conversion section of the first stage up to the data conversion section of the final stage.

In this type of parallel-serial converter circuit described above, when the data conversion sections of the respective stages are operated according to the timing of clock signals, a reference clock signal or a clock signal having been frequency-converted from this reference clock signal, which respectively corresponds to the operating frequency of the respective data conversion sections, is given sequentially to the data conversion section of the first stage up to the data conversion section of the final stage, and consequently the input timing of clock signals to the data conversion section of each stage becomes delayed in a direction the same as the data signal propagation direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereunder, embodiments of the invention are described in detail, with reference to accompanying diagrams.

Figure 4:
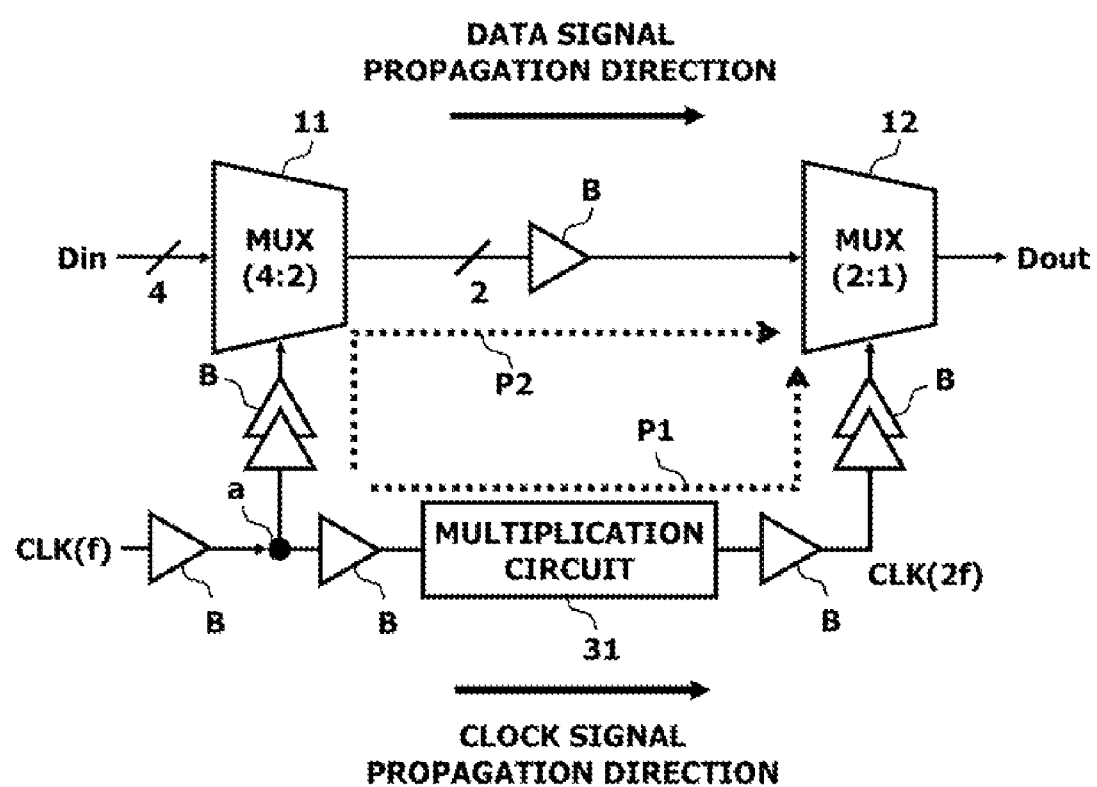
FIG. 4 is a functional block diagram illustrating a configuration of a first embodiment of a parallel-serial converter circuit.

FIG. 4 is a functional block diagram illustrating a configuration of a first embodiment of a parallel-serial converter circuit.

In FIG. 4, a parallel-serial converter circuit of the present embodiment is, for example, provided with a first stage data conversion section 11 to which four data signals Din are parallel-input, and a second stage data conversion section 12 to which two data signals having been serial-converted in the data conversion section 11 are parallel-input.

To this parallel-serial converter circuit there is externally given a reference clock signal CLK(f) having a frequency f corresponding to the data rate of the data signal Din input to the data conversion section 11, and the first stage data conversion section 11 is operated according to the clock signal CLK(f). Moreover, the parallel-serial converter circuit is provided with a multiplication circuit 31 which multiplies the frequency f of the clock signal CLK(f) by two, and the second stage data conversion section 12 is operated according to a clock signal CLK(2f) having a frequency 2f output from the multiplication circuit 31.

Furthermore, on the paths of signals (data signals and clock signals) which propagate respectively between the respective data conversion sections 11 and 12 and the multiplication circuit 31, there are appropriately arranged buffer circuits B serving as delaying elements, and the electrical length of the propagation path of each signal is adjusted so that the absolute value of a relative differential delay between the phase of the data signal parallel-input to the second stage data conversion section 12 and the phase of the clock signal CLK(2f) given to the data conversion section 12 becomes an integral multiple of one cycle of the clock signal CLK(2f).

In the parallel-serial converter circuit of the above configuration, the propagation direction of data signals on the data conversion sections 11 and 12 side, and the propagation direction of clock signals on the multiplication circuit 31 side are the same direction (the left to right direction in FIG. 4). Therefore, the distance of a clock signal propagation path P1 from a branch point "a" of the clock signal CLK(f) via the multiplication circuit 31 to the data conversion section 12, and the distance of a path P2 which combines a clock signal propagation path from the branch point "a" of the clock signal CLK(f) to the data conversion section 11, and a data signal propagation path from the first stage data conversion section 11 to the second stage data conversion section 12, are substantially the same. As a result, the signals propagating through the respective paths P1 and P2 respectively receive the same level of influence in those cases where variations occur in the power supply voltage or temperature of the parallel-serial converter circuit, or manufacturing variations occur in the circuit. Therefore variations in the differential delays in the propagation time of each signal, which occurs as a result of variations in power supply voltage and so forth, are suppressed. That is to say, the absolute value of a relative differential delay between the phase of the data signal parallel-input to the second stage data conversion section 12 and the phase of the clock signal CLK(2f) given to the data conversion section 12, is maintained in the vicinity of an integral multiple of one cycle of the clock signal CLK(2f), even in those cases where variations occur in power supply voltage and so forth.

Here, the parallel-serial converter circuit of the first embodiment is described in more detail with an example of a specific circuit configuration.

Figure 5:
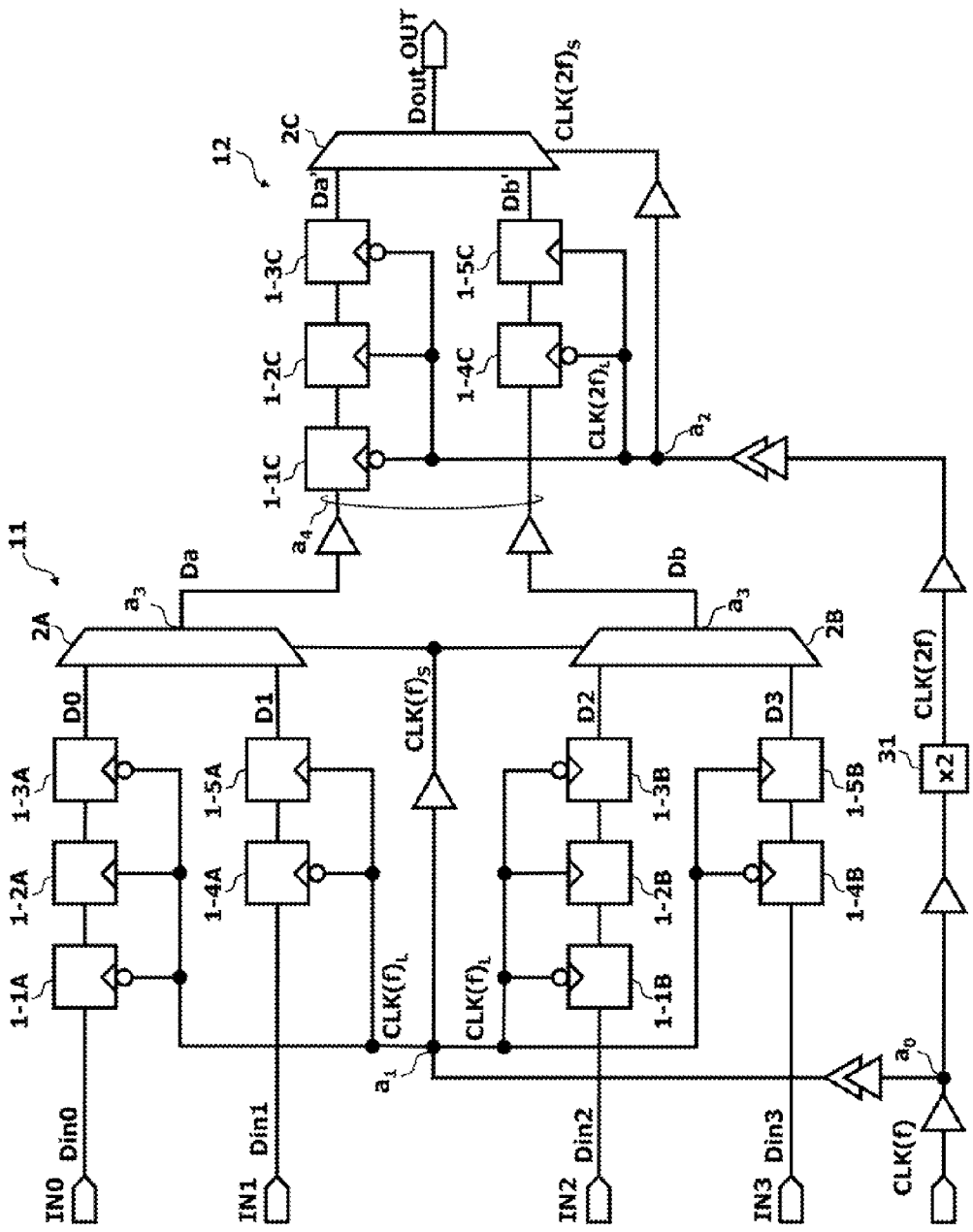
FIG. 5 is a circuit diagram illustrating a specific configuration example for the first embodiment.

FIG. 5 is a circuit diagram illustrating a specific configuration example of the parallel-serial converter circuit of the first embodiment.

Figure 1:
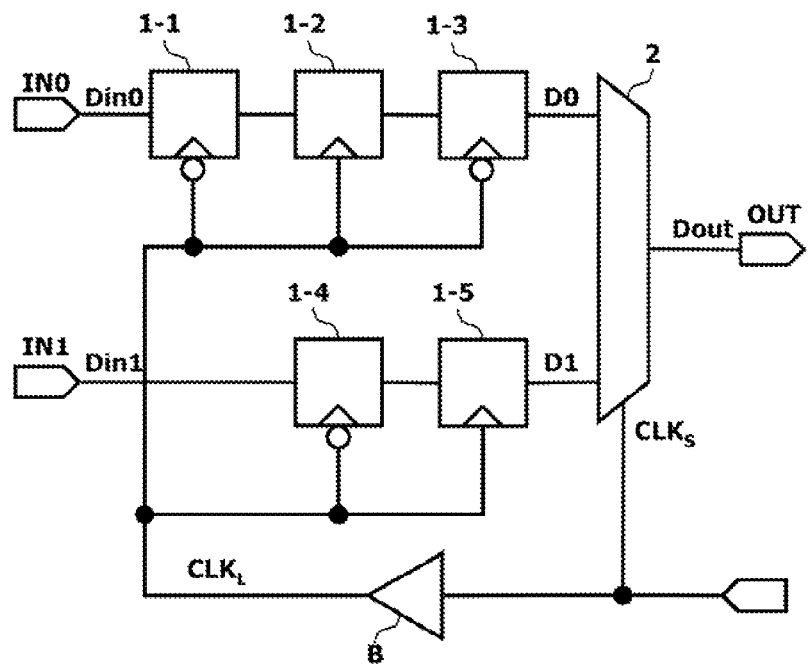
FIG. 1 is a diagram illustrating a configuration example of a general parallel-serial converter circuit.
Figure 2:
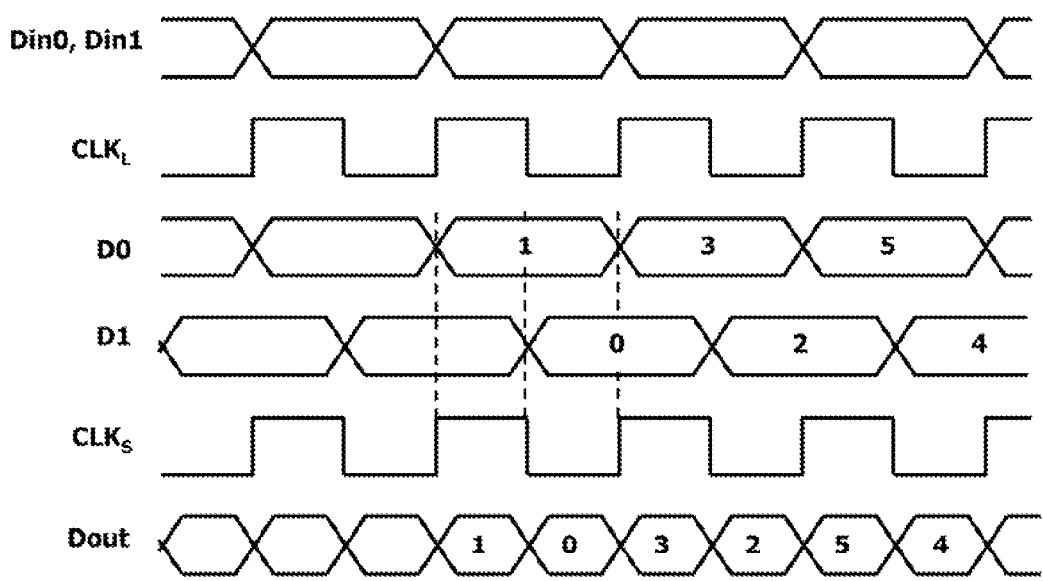
FIG. 2 is a timing chart of signals processed by the circuit of FIG. 1.

In the configuration example of FIG. 5, the first data conversion section 11 is configured by connecting two conversion units in parallel with the aforementioned general parallel-serial converter circuit illustrated in FIG. 1 serving as a single conversion unit. Specifically, in the data conversion section 11, a data signal Din0 input to an input terminal IN0 among four input terminals IN0, IN1, IN2, and IN3 is latched sequentially in cascade-connected three flip-flops 1-1A, 1-2A, and 1-3A, and is then given as a selection data signal D0 to one of input ports of a selector 2A. Moreover, a data signal Din1 input to the input terminal IN1 is latched sequentially in cascade-connected two flip-flops 1-4A and 1-5A, and is then given as a selection data signal D1 to the other input port of the selector 2A. Furthermore, a data signal Din1 input to an input terminal IN2 is latched sequentially in cascade-connected three flip-flops 1-1B, 1-2B, and 1-3B, and is then given as a selection data signal D2 to one of input ports of a selector 2B. Moreover, a data signal Din3 input to the input terminal IN3 is latched sequentially in cascade-connected two flip-flops 1-4B and 1-5B, and is then given as a selection data signal D3 to the other input port of the selector 2B.

The respective flip-flops 1-1A to 1-5A and 1-1B to 1-5B serving as latching circuits operate in accordance with a clock signal $CLK(f)_L$ having a frequency corresponding to the data rate of the input data signals Din0 to Din3. The flip-flops 1-2A, 1-5A, 1-2B, and 1-5B execute a setup and a hold according to the rising edge of the clock signal $CLK(f)_L$. Moreover, the flip-flops 1-1A, 1-3A, 1-4A, 1-1B, 1-3B, and 1-4B execute a setup and a hold according to the falling edge of the clock signal $CLK(f)_L$. As a result, the input timing of the selection data signals D0 and D1 input to the selector 2A is adjusted so that the phases thereof are different from each other by 180°. Moreover, the input timing of the selection data signals D2 and D3 input to the selector 2B is also adjusted so that the phases thereof are different from each other by 180°.

The selector 2A is switching-operated according to a clock signal CLK $(f)_S$ having a frequency f and alternately selects the selection data signals D0 and D1 to thereby output a serial-converted data signal Da. Moreover, as with the selector 2A above, the selector 2B is also switching-operated according to the clock signal $CLK(f)_S$ and alternately selects the selection data signals D2 and D3 to thereby output a serial-converted data signal Db. The data signals Da and Db output from the respective selectors 2A, 2B have a data rate corresponding to a frequency twice that of the clock signal $CLK(f)_S$.

The second stage data conversion section 12 is of a configuration similar to that of the aforementioned general parallel-serial converter circuit illustrated in FIG. 1. Here, the data signal Da output from the selector 2A of the first stage data conversion section 11 is latched sequentially in the cascade-connected three flip-flops 1-1C, 1-2C, and 1-3C, and is given as a selection data signal Da' to one of input ports of a selector 2C. Moreover, the data signal Db output from the selector 2B is latched sequentially in the cascade-connected two flip-flops 1-4C and 1-5C, and is given as a selection data signal Db' to the other input port of the selector 2C.

The respective flip-flops 1-1C to 1-5C are operated according to a clock signal $CLK(2f)_L$ having a frequency 2f, in which the clock signal CLK(f) has been multiplied by two in the multiplication circuit 31. The flip-flops 1-2C and 1-5C execute a setup and a hold according to the rising edge of the clock signal $CLK(2f)_L$, and the flip-flops 1-1C, 1-3C, and 1-4C execute a setup and a hold according to the falling edge of the clock signal $CLK(2f)_L$. As a result, the input timing of the selection data signals Da' and Db' input to the selector 2C is adjusted so that the phases thereof are different from each other by 180°.

The selector 2C is operated according to a clock signal $CLK(2f)_S$ output from the multiplication circuit 31 and alternately selects the selection data signals Da' and Db', to thereby generate a serial-converted data signal Dout, and externally output this data signal Dout from an output terminal OUT. The data signal Dout output from the output terminal OUT has a data rate corresponding to a frequency twice that of the clock signal $CLK(2f)_S$, that is, a data rate four times that of the data signals Din0 to Din3 parallel-input to the input terminals IN0 to IN3.

In the specific circuit configuration illustrated in FIG. 5, the distance of a clock signal propagation path from a branch point $a_0$ of the clock signal CLK(f) via the multiplication circuit 31 to a clock input point $a_2$ of the data conversion section 12, and the distance which combines a clock signal propagation path from the branch point $a_0$ of the clock signal CLK(f) to a clock input point $a_1$ of the data conversion section 11 and a data signal propagation path from a data output point $a_3$ of the data conversion section 11 to a data input point $a_4$ of the data conversion section 12, are substantially the same. As a result, the absolute value of a relative differential delay between the phase of the data signals Da and Db reaching the data input point $a_4$ of the data conversion section 12 and the phase of the clock signal CLK(2f) reaching the clock input point $a_2$ of the data conversion section 12, is maintained in the vicinity of an integral multiple of one cycle of the clock signal CLK(2f) even in those cases where variations occur in power supply voltage and so forth.

Figure 3:
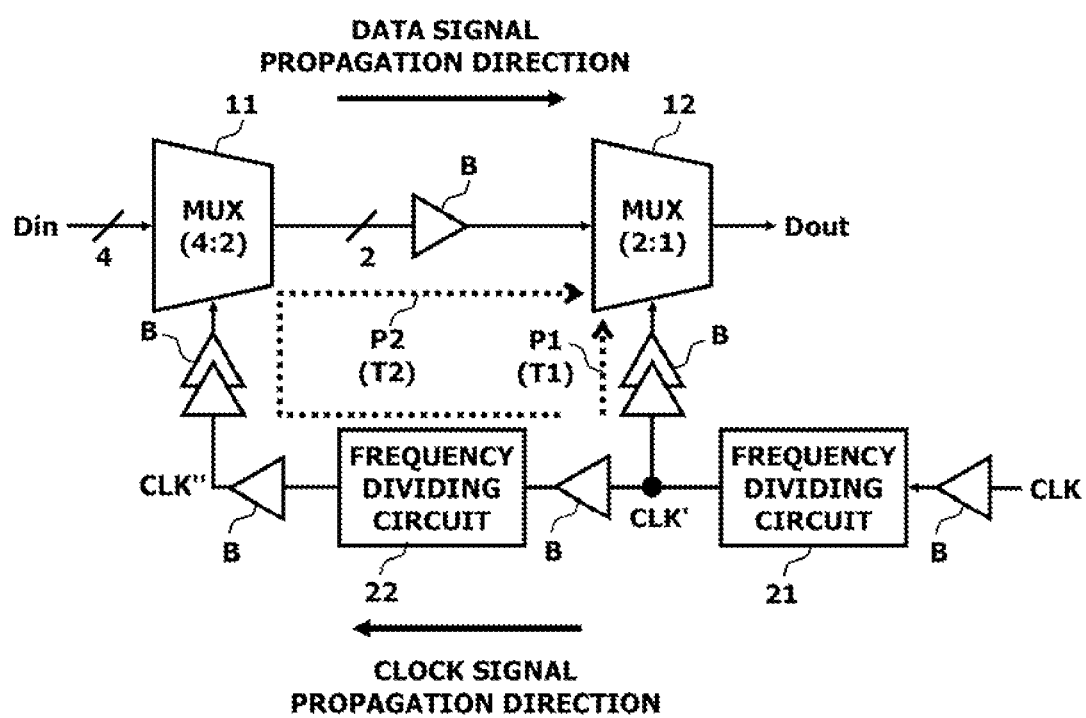
FIG. 3 is a functional block diagram illustrating an example of a conventional parallel-serial converter circuit having a two-stage configuration.
Figure 6:
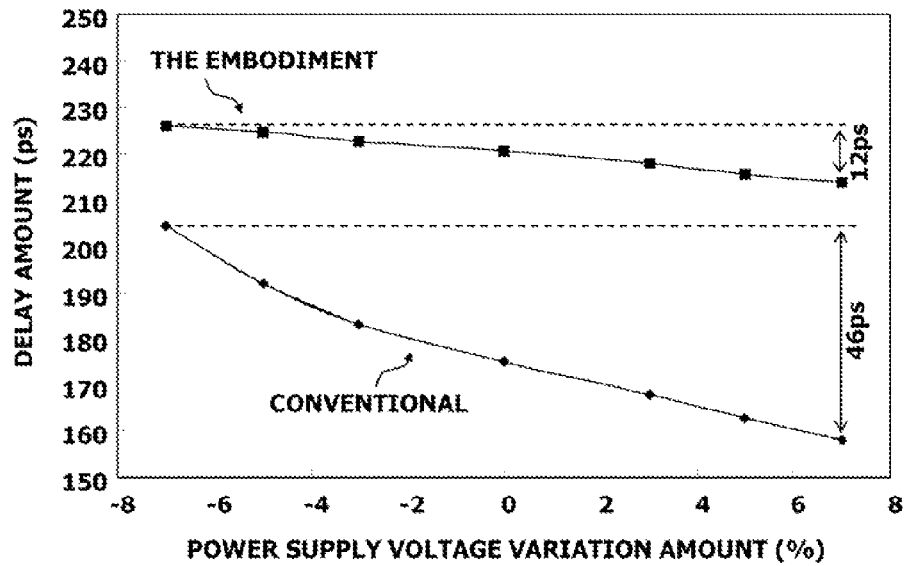
FIG. 6 is a diagram illustrating an example of variations in the amount of delay with respect to the amount of variation in power supply voltage in the first embodiment.

FIG. 6 is an example illustrating variations in the amount of phase delays between data signals and clock signals given to the second stage data conversion section 12 with respect to the amount of variations in power supply voltage in the above parallel-serial converter circuit, compared to a conventional circuit configuration (refer to FIG. 3). In this example of FIG. 6, variations in the amount of delays in a case where variations occur in power supply voltage of the parallel-serial converter circuit within a range of ±7% are suppressed to 12 ps by applying the circuit configuration of the embodiment, whereas variations are 46 ps in the conventional circuit configuration.

The delay amount in the circuit configuration of the embodiment is increased overall from the delay amount of the conventional circuit configuration, and this is due to the difference in the arrangement (distance) of the respective propagation paths P1 and P2, and the difference in the settings of the buffer circuits B arranged on each of the paths. In either one of the configurations, the circuit is designed so that the delay amount when the amount of variation in power supply voltage is 0% becomes an integral multiple of one cycle of the clock signal given to the second stage data conversion section 12.

As described above, according to the parallel-serial converter circuit of the first embodiment, in those cases where there is externally given a reference clock signal CLK(f) having a frequency f corresponding to the data rate of the input data signals Din0 to Din3, the first stage data conversion section 11 is operated according to this clock signal CLK(f) and the second stage data conversion section 12 is operated according to a clock signal CLK(2f), in which the clock signal CLK(f) has been multiplied by two in the multiplication circuit 31. Consequently, even in those cases where variations occur in power supply voltage, timing deviation of the data signals and clock signals input to the output stage data conversion section 12 can be suppressed. Therefore, it becomes possible to reliably execute parallel-serial conversion of high-speed data signals.

Next, a second embodiment of a parallel-serial converter circuit is described.

In the first embodiment described above, there was illustrated the configuration example in which the externally given reference clock signal of a frequency f was multiplied by two in the multiplication circuit 31. However, in general, a multiplication circuit capable of handling high frequencies cannot be easily realized while satisfying a required precision, and even if such a circuit can be realized, with the current technology, the circuit size of the multiplication circuit inevitably becomes large compared to a frequency dividing circuit used for clock signal processing in the conventional circuit configuration (FIG. 3). Consequently, in the second embodiment there is described a configuration example in which a circuit is devised so that variations in differential delays caused by variations in power supply voltage can be suppressed while processing clock signals, using a frequency dividing circuit as practiced conventionally.

Figure 7:
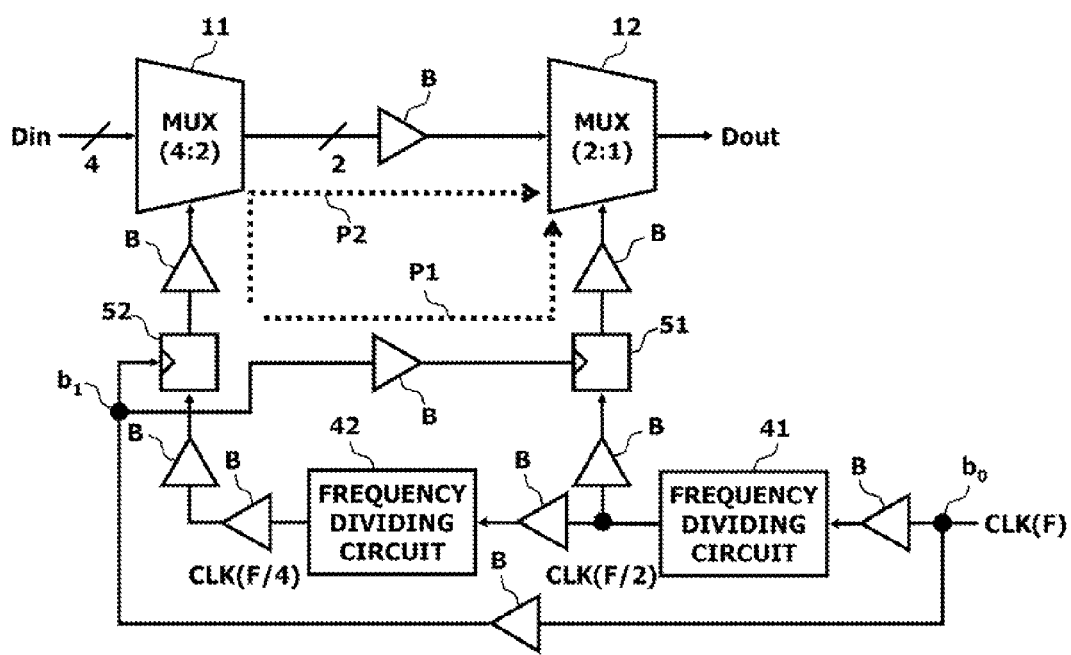
FIG. 7 is a functional block diagram illustrating a configuration of a second embodiment of a parallel-serial converter circuit.

FIG. 7 is a functional block diagram illustrating a configuration of the parallel-serial converter circuit of the second embodiment.

In FIG. 7, the parallel-serial converter circuit of this embodiment is provided with data conversion sections 11 and 12 similar to those in the case of the first embodiment described above. To this parallel-serial converter circuit there is externally given a reference clock signal CLK(F) having a frequency F corresponding to the data rate of a data signal Dout output from the second stage data conversion section 12. As with the aforementioned case of the conventional configuration illustrated in FIG. 3, this reference clock signal CLK (F) is given to a frequency dividing circuit 41, and there is generated a clock signal CLK(F/2) in which the frequency F is divided to ½.

This clock signal CLK(F/2) having the frequency F/2 is given to a flip-flop 51 and is then sent to the second stage data conversion section 12, and further, it is given to a frequency dividing circuit 42 which is separate from the frequency dividing circuit 41. The frequency dividing circuit 42 generates a clock signal CLK(F/4) in which the frequency of the clock signal CLK(F/2) is further divided into ½. This clock signal CLK(F/4) having the frequency F/4 is given to a flip-flop 52, and is then sent to the first stage data conversion section 11.

The respective flip-flops 51 and 52 respectively execute a setup and a hold according to the clock signal CLK(F) having the frequency F which is the frequency prior to dividing by the frequency dividing circuit 41. In this relation, there is designed a wiring pattern of paths which conduct the clock signal CLK(F) to a clock input terminal of the respective flip-flops 51 and 52, so that the timing of giving the clock signal CLK(F) to the flip-flops 52 is ahead, and the timing of giving the clock signal CLK(F) to the flip-flops 51 is back. Here, the path of the clock signal CLK(F) is formed so that the clock signal CLK(F) taken out as a re-timing clock signal from a branch point $b_0$ on the input side of the frequency dividing circuit 41 is conducted to a branch point $b_1$ in the vicinity of the flip-flop 52, and is then given sequentially to the clock input terminal of the flip-flop 52 and the clock input terminal of the flip-flop 51. On the path between the branch points $b_0$ and $b_1$, and on the path between the branch point $b_1$ and the clock input terminal of the flip-flop 51, there are arranged buffer circuits B.

The clock signal CLK(F) is given to the respective flip-flops 51 and 52 in the above manner, to thereby perform re-timing of the clock signals CLK(F/2) and CLK(F/4) sent from the respective flip-flops 51 and 52 to the respective data conversion sections 12 and 11. This re-timing is performed in a manner such that after having performed re-timing of the clock signal CLK(F/4) which operates the first stage data conversion section 11, re-timing of the clock signal CLK(F/2) which operates the second stage data conversion section 12 is performed, according to the order in which the clock signal CLK(F) is given to the respective flip-flops 51 and 52. That is to say, re-timing of the respective clock signals (F/2) and CLK(F/4) which operate the data conversion sections 11 and 12 of the respective stages, is sequentially executed in the direction the same as the propagation direction of the data signals on the data conversion sections 11 and 12 side.

As a result, the distance of a path P1 which combines a propagation path of the clock signal CLK(F) from the branch point $b_1$ in the vicinity of the flip-flop 52 to the flip-flop 51, and a propagation path of the clock signal CLK(F/2) from the flip-flop 51 to the second stage data conversion section 12, and the distance of a path P2 which combines a propagation path of the clock signal CLK (F/4) from the flip-flop 52 to the first stage data conversion section 11, and a propagation path of the data signal from the first data conversion section 11 to the second stage data conversion section 12, become substantially the same. Consequently, as with the case of the first embodiment described above, the signals propagating through the respective paths P1 and P2 respectively receive the same level of influence in those cases where variations occur in the power supply voltage or temperature of the parallel-serial converter circuit, or manufacturing variations occur in the circuit. Therefore variations in the differential delays in the propagation time of each signal, which occur as a result of variations in power supply voltage and so forth, are suppressed. That is to say, the absolute value of a relative differential delay between the phase of the data signal parallel-input to the second stage data conversion section 12 and the phase of the clock signal CLK(F/2) given to the data conversion section 12, is maintained in the vicinity of an integral multiple of one cycle of the clock signal CLK(F/2) even in those cases where variations occur in power supply voltage and so forth.

As described above, according to the parallel-serial converter circuit of the second embodiment, in those cases where a reference clock signal CLK(F) having a frequency F corresponding to the data rate of an output data signal Dout is externally given, even if this reference clock signal CLK(F) is frequency divided in the frequency dividing circuits 41 and 42 to thereby generate clock signals CLK (F/2) and CLK(F/4), and re-timing of these respective clock signals CLK(F/2) and CLK(F/4) is performed by the flip-flops 51 and 52 in the order corresponding to the data propagation direction to thereby give them to the data conversion sections 12 and 11 of the respective stages, an effect similar to that in the case of the first embodiment described above can be obtained. Furthermore, the clock signal processing is performed with use of a frequency dividing circuit, which can be realized more easily and the circuit size of which is smaller compared to a multiplication circuit. Therefore it is also possible to achieve cost reduction and size reduction of the parallel-serial converter circuit.

Figure 8:
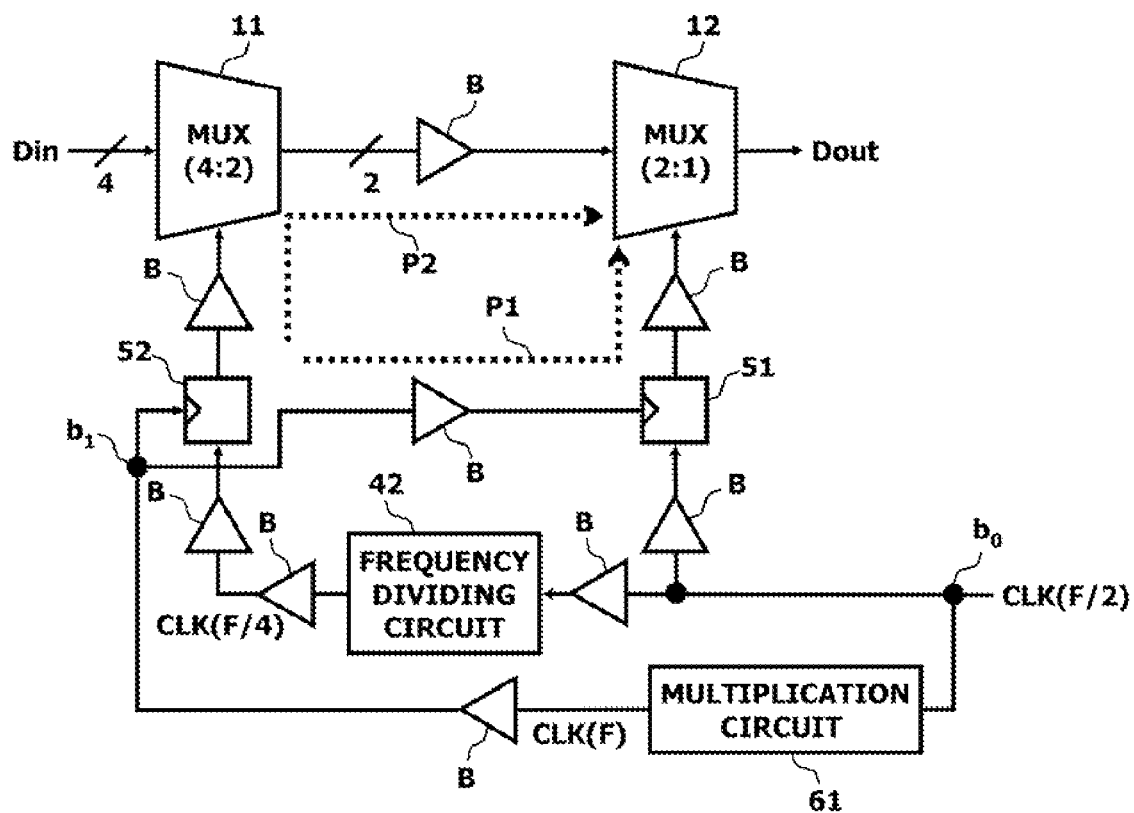
FIG. 8 is a functional block diagram illustrating another configuration example related to the second embodiment.

In the second embodiment above, there has been described a case where a reference clock signal CLK(F) having a frequency F corresponding to the data rate of an output data signal Dout is externally given. However, as illustrated in FIG. 8 for example, an application of the configuration of the second embodiment is also possible in a case where a reference clock signal CLK(F/2) having a frequency F/2 corresponding to the data rate of a data signal parallel-input to the second stage data conversion section 12 is externally given. In this case, the external reference clock signal CLK(F/2) is given to the flip-flop 51, and is also frequency divided by the frequency dividing circuit 42 to thereby generate a clock signal CLK(F/4), and then this clock signal CLK(F/4) is given to the flip-flop 52. Moreover, the reference clock signal CLK (F/2) is given to a multiplication circuit 61 to be multiplied by two, and a re-timing clock signal CLK(F) output from the multiplication circuit 61 is given sequentially to the respective flip-flops 52 and 51 through the branch point $b_1$, to thereby perform re-timing of the respective clock signals CLK(F/2) and CLK(F/4).

Furthermore, in the first and second embodiments described above, there has been described the two-stage configuration in which the first stage data conversion section 11 generates two serial data signals from four parallel data signals, and the second data conversion section 12 generates one serial data signal from two parallel data signals. In this type of configuration, normally, a data conversion section of each stage is configured by combining a plurality of conversion units where a circuit, in which one serial data signal is generated from two parallel data signals (FIG. 1), serves as a single conversion unit (FIG. 5). However, the configuration of the data conversion section of each stage in the invention is not limited to the one example described above. That is to say, a circuit in which one serial data signal is generated from n parallel data signals (where n is an integer of 2 or more) may also serve as a single conversion unit.

Specifically, considering a parallel-serial converter circuit of a two-stage configuration, the first stage data conversion section is to have an application of a configuration in which n-number of n:1 conversion units are connected in parallel, and the second stage data conversion section is to have an application of one n:1 conversion unit. In this case, the frequency of the clock signal given to the first stage data conversion section is a frequency f which corresponds to the data rate of the input data signal Din, or $1/n^2$ of a frequency F which corresponds to the data rate of the output data signal Dout. Moreover, the frequency of the clock signal given to the second stage data conversion section is a frequency n times that of the frequency f which corresponds to the data rate of the input data signal Din, or 1/n of a frequency F which corresponds to the data rate of the output data signal Dout.

Furthermore, in the first and second embodiments described above, there has been described the parallel-serial converter circuit of a two-stage configuration, however, the invention may be applied to a configuration of three or more stages. Specifically, when considering a case of configuring data conversion sections of m stages in combination with a 2:1 conversion unit where m is an integer of 2 or more, the first stage data conversion section generates $2^{(m-1)}$ serial data signals from $2^m$ parallel data signals, the second data conversion section generates $2^{(m-2)}$ serial data signals from $2^{(m-1)}$ parallel data signals, and subsequently the m-th stage data conversion section generates one serial data signal from two parallel data signals in a similar manner. Also for this type of m-stage configuration, with an application of a clock side circuit configuration similar to that in the cases of the first and second embodiments described above, variations in differential delays caused by variations in power supply voltage can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A parallel-serial converter circuit comprising:
   a plurality of data converters configured to convert a plurality of parallel-input data signals into serial data signals according to a timing of clock signals, and the respective data converters are multistage connected;
   a clock frequency converter configured to convert an externally given reference clock signal into a clock signal of a different frequency; and
   a clock propagation path which is formed so that frequency-corresponding clock signals among the reference clock signal and the clock signal which has been frequency-converted in the clock frequency converter, are given sequentially to the data converter of the first stage up to the data converter of the final stage.

2. The parallel-serial converter circuit according to claim 1, wherein:
   the reference clock signal has a frequency corresponding to a data rate of a data signal parallel-input to the data converter of the first stage;
   the clock frequency converter includes a multiplication circuit configured to multiply the reference clock signal to thereby generate a clock signal which operates data converters of second and subsequent stages; and
   the clock propagation path gives the reference clock signal to the data converter of the first stage, and gives the clock signal generated in the multiplication circuit sequentially to the data converters of the second and subsequent stages corresponding to the frequency.

3. The parallel-serial converter circuit according to claim 1, wherein:
the reference clock signal has a frequency corresponding to a data rate of a data signal output from the data converter of the final stage;
the clock frequency converter includes a frequency dividing circuit configured to divide the frequency of the reference clock signal to thereby generate a clock signal which operates the data converter of each stage; and
the clock propagation path is provided with an individual flip-flop on each of paths which respectively conduct the clock signal generated in the frequency dividing circuit to the frequency-corresponding data converter, and the respective flip-flops perform re-timing of the clock signal generated in the frequency dividing circuit according to the timing of the reference clock signal which is given sequentially to the flip-flop corresponding to the data converter of the first stage up to the flip-flop corresponding to the data converter of the final stage.

4. The parallel-serial converter circuit according to claim 1, wherein:
the reference clock signal has a frequency corresponding to a data rate of a data signal parallel-input to the data converter of the final stage;
the clock frequency converter includes a frequency dividing circuit configured to divide the frequency of the reference clock signal to thereby generate a clock signal for operating the data converters of the respective stages excluding the final stage, and a multiplication circuit configured to multiply the reference clock signal to thereby generate a re-timing clock signal having a frequency corresponding to a data rate of a data signal output from the data converter of the final stage; and
the clock propagation path is provided with an individual flip-flop on a path which conducts the reference clock signal to the data converter of the final stage and on each of paths which respectively conduct the clock signal generated in the frequency dividing circuit to the frequency-corresponding data converter, and the respective flip-flops are such that the re-timing clock signal generated in the multiplication circuit is given sequentially to the flip-flop corresponding to the data converter of the first stage up to the flip-flop corresponding to the data converter of the final stage, and re-timing of the clock signal generated in the frequency dividing circuit is performed according to the timing of the re-timing clock signal.

5. The parallel-serial converter circuit according to claim 1, wherein
the respective data converters include at least one conversion unit which generates one serial data signal from n-number of parallel data signals where n is an integer of 2 or more.

6. The parallel-serial converter circuit according to claim 5, wherein
the conversion unit has a plurality of flip-flops which are operated by clock signals propagated through the clock propagation path, and one selector, and the conversion unit sequentially selects, with the selector, any one of n-number of parallel data signals, in which the relative phase relationship thereof is adjusted with a combination of the respective flip-flops, to thereby generate one serial data signal.

7. The parallel-serial converter circuit according to claim 5, wherein
the conversion unit generates one serial data signal from two parallel data signals.

8. The parallel-serial converter circuit according to claim 1, wherein
there is provided buffer circuits on the clock propagation path and on a data propagation path between the data converters, so that the absolute value of a relative differential delay between the phase of the data signal parallel-input to the respective data converters of the second and subsequent stages, and the phase of the clock signal given to these data converters, become an integral multiple of one cycle of the clock signal given to these data converters.

* * * * *